(12) United States Patent
Karam

(10) Patent No.: US 6,310,781 B1
(45) Date of Patent: Oct. 30, 2001

(54) CONNECTION PIN LAYOUT FOR CONNECTING INTEGRATED MAGNETICS MODULES TO A PRINTED CIRCUIT BOARD

(75) Inventor: Roger A. Karam, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/282,521

(22) Filed: Mar. 31, 1999

(51) Int. Cl.[7] ...................................................... H05K 1/18
(52) U.S. Cl. ......................... 361/764; 361/760; 361/761; 361/773; 361/774; 439/610; 439/676
(58) Field of Search ...................................... 361/760, 761, 361/773–779; 439/541.5, 701, 676, 262, 607–610

(56) References Cited

U.S. PATENT DOCUMENTS

| | | | |
|---|---|---|---|
| 5,122,691 | | 6/1992 | Balakrishnan ........................ 307/475 |
| 5,531,612 | * | 7/1996 | Goodall et al. .................... 439/541.5 |
| 5,639,267 | * | 6/1997 | Loudermilk .......................... 439/701 |
| 5,775,946 | * | 7/1998 | Briones ................................ 439/607 |
| 5,779,488 | | 7/1998 | Cluff ...................................... 439/73 |
| 6,033,266 | * | 3/2000 | Long .................................... 439/676 |
| 6,036,547 | * | 3/2000 | Belopolsky et al. ................. 439/262 |
| 6,059,581 | * | 5/2000 | Wu ......................................... 439/79 |
| 6,068,520 | * | 5/2000 | Winings et al. ..................... 439/676 |
| 6,099,349 | * | 8/2000 | Boutros .............................. 439/541.5 |
| 6,162,089 | * | 12/2000 | Costello et al. ................... 439/541.5 |

OTHER PUBLICATIONS

Macaulay, Peter, "Re: Data Communication Cabling FAQ." In Cabling FAQ [online], Jan. 15, 1995 [retrieved on Jan. 19, 1999]—Retrieved from the Internet: <URL:http://www.lick.pvt.k12.ca.us/baisnet/net/cabling–faq>, pp. 1–11.

"MagJack Modular Jacks with Integrated Magnetics, 72 Series", Mar. 12, 1999, Stewart Connector [retrieved on Mar. 12, 1999] retrieved from the Internet: <URL:www-.stewartconnector.com>, 6 pp.

"RJ45 Integrated 10/100 Base Magnetics", [retrieved on Mar. 11, 1999] retrieved from the Internet: <URL: http://www.trans–power.com/RJ7xx.html>.

Runkel, Mark A., "Ethernet Q&A". [online], Dec. 1994, [retrieved on Jan. 22, 1999]—Retrieved from the Internet: <URL:http://web.syr.edu/~jmwobus/comfaqs/faq.comp.d-com.lans.ethernet>, pp. 1–18.

* cited by examiner

Primary Examiner—Jeffrey Gaffin
Assistant Examiner—Tuan Dinh
(74) Attorney, Agent, or Firm—Thelen Reid & Priest LLP; David B. Ritchie

(57) ABSTRACT

A connection pin layout for connecting one or more integrated magnetics modules (IMMs) to a printed circuit board (PCB) for reduced electromagnetic interference (EMI) includes grouping and locating the connection pins based on the signals passed through the connection pins and a method of routing traces to the connection pins. The connection pins carrying power between the PCB and the IMMs are located together and on the periphery of the connection pin layout. The traces to the power pins are routed to avoid passing under the data and ground connection pins or crossing the traces to the data and ground connection pins. When multiple IMMS are connected to a PCB, the connection pin layout coordinates the location of connection pins among IMMs and integrates the grouping of the connection pins for multiple IMMs.

18 Claims, 7 Drawing Sheets

CONNECTION PIN LAYOUT FOR CONNECTING INTEGRATED MAGNETICS MODULES TO A PRINTED CIRCUIT BOARD

BACKGROUND OF THE INVENTION

1. Field of the Invention

The present invention relates to connecting devices to printed circuit boards. More particularly, the present invention relates to a layout of connecting pins for connecting integrated magnetics transceiver modules to a printed circuit board.

2. The Background

Computer networks using electrically conductive cables to connect a number of computers and associated network devices are common. Each device connected in such a network must transfer signals between the cable and the network device. Some network devices, such as hubs and switches, may typically have many cable connections making the efficient transfer of signals to and from these cables a critical task for the device.

Transceivers are devices that may be used to transfer signals between the cable and the network device. Transceivers typically contain one or more transmit and receive ports, each with a separate magnetic transformer for processing the signals for that port. The present invention relates to the parts of the transceiver containing the magnetic transformers, which are referred to as "magnetics" in the industry. As used in this disclosure, the term "magnetics" will refer to the magnetic transformers and they will be distinguished from the rest of the transceiver components. The magnetics may transfer data to and from the transceiver by this definition. It is assumed that the components of the transceiver, other than the magnetics, are located on a printed circuit board (PCB). Thus, a transfer of data to a PCB is synonymous with the transfer of data to a transceiver. Although this arrangement of the transceiver on a PCB is widely used, the present invention is not intended to be limited to any particular arrangement of the other transceiver components.

As is known by those of ordinary skill in the art, transformer operations are based upon the principal of inductance, and may generate unwanted electromagnetic fields and electromagnetic interference (EMI), adversely effecting other nearby electrical signals. The reverse is also true: nearby electrical signals may affect the magnetics and cause EMI which may in turn pass unwanted frequencies to the output of the magnetics. The reduction of EMI output is often a technically difficult, although important task. Problems arising from excessive EMI may include dropped network data packets, slower system performance and intermittent device failures. In extreme cases, high EMI may violate Federal Communication Commission regulations and/or prevent devices from operating.

In the past, magnetics were often located on the surface of a PCB, with signals between the transceiver and the cable routed to the magnetics for processing. This design allows the magnetics to be easily connected to other devices on the PCB, however, the location of the magnetics near these other devices may lead to EMI problems. A recent development in the industry has been the use of integrated magnetics modules (IMMs) in which the magnetics are located at the cable connectors and thus off of the actual surface of the PCB, often within a separate electrically shielded chassis to minimize the adverse EMI effects.

The present invention is directed to the connecting of one or more IMMs to the PCB. Unlike the case where the magnetics are located on the surface of the PCB, devices using IMMs do not need to route the signal of each conductor within a cable to the PCB for processing. Instead, only the signals to and from the IMMs, which are not the same as the signals carried by the cable, need to be routed between the PCB and the IMMs.

The connection pins are used to transfer signals between the PCB and conductive signal carrying media such as cables. Such cables are used in computer networks to couple signals to various devices on the network. The connection pin layout defines the geometry of the connection pins. That is, the connection pin layout defines which pin is next to which other pin and how the connection pins are grouped and oriented with respect to the PCB. This layout can be thought of as the "footprint" of the connection pins as they appear on the PCB, or equivalently the footprint of the connections on an IMM that connects to these pins. The connection pin layout of the present invention locates the connection pins, and routes the traces to the pins, in such a way as to minimize EMI effects on the signals transferred through the pins.

Traditionally, cables are connected to "plugs" such as, but not limited to, eight pin RJ-45 connectors as specified by the Electronic Industry Association (EIA)/Telecommunications Industry Association (TIA) and widely used in computer networks. The plugs are then connected to a circuit board with a number of conductors, corresponding to the individual cable conductors. The processing of data signals to and from the cables is done on the PCB "downstream" from these conductors. That is, magnetics used to process the signals to and from the cables were, in the past, separated from the plugs by the conductors.

Referring to FIG. 1, a cable 2 with an attached plug 4 that mates with socket 6 is shown. The cable signals are carried by conductors 8 to connection pins 10 on PCB 12. The processing of the signals is done downstream of connection pins 10 by magnetics package 14 on PCB 12. When more than one cable 2 is connected to PCB 12, such as may be found in a network switch connected to a number of network devices, multiple sets of conductors 8 may be used, with one set for each cable plug 4. The one-to-one correspondence between the cable conductors 8 and the signals routed to the circuit is often carried over to the design of the connection pin layout. For example, signals from a single eight-conductor cable 2 with an eight pin RJ-45 plug may be transferred to PCB 12 using eight individual conductors 8, and with a connection pin layout in an orientation corresponding to that of the RJ-45 plug. Connections to PCB 12 from multiple cables 2 may use multiple sets of conductors 8, with each set of conductors 8 having a connection pin layout corresponding to the cable plug 4 attached to the cable 2. For example, a network connected to four cables 2, each with eight conductors 8 and an RJ-45 plug, would typically route four sets of eight conductors 8 to PCB 12 with four separate sets of eight connection pins 10, each set having a connection pin layout corresponding to an RJ-45 plug.

Many cable networks, however, do not use eight-conductor cables 2. For example, the Ethernet 10Base-T protocol, which is widely used in computer networks, uses only four conductors, although in many cases the cables 2 connecting the devices in such a network may contain eight conductors. The present invention is not intended to be limited in this respect.

A recent development in the art is the use of IMMs, in which magnetics are integrated into the plugs used to connect the cables 2. Such IMMs may be electrically shielded from PCB 12 with a small surrounding metal chassis. It is the signals to and from the IMMs, rather than the signals carried by the individual cable conductors, that are then transferred to and from PCB 12.

Known prior art IMM to PCB connection pin layouts attempt to mimic the number and layout of cable to IMM connections. No known prior art system modifies the IMM to PCB connection pin layout or focuses on the nature of the signals that are passed through those connections to arrive at an optimal location of the connections for those signals on the PCB. No known prior art system uses the existence of two or more cable connections to coordinate the location of connection pins for a more optimal (in terms of EMI reduction or containment) connection pin layout on the PCB.

It would be desirable to provide a connection pin layout for connecting IMMs to a PCB that provides optimal location of the signals on the PCB for reduced EMI. Furthermore, it would be desirable to provide a connection pin layout that coordinates the location of signal connections from a plurality of devices.

SUMMARY OF THE INVENTION

A connection pin layout for connecting one or more integrated magnetics modules (IMMs) to a printed circuit board (PCB) for reduced electromagnetic interference (EMI) includes grouping and locating the connection pins based on the signals passed through the connection pins and a method of routing traces to the connection pins. The connection pins carrying power between the PCB and the IMMs are located together and on the periphery of the connection pin layout. The traces to the power pins are routed to avoid passing under the data and ground connection pins or crossing the traces to the data and ground connection pins. When multiple IMMs are connected to a PCB, the connection pin layout may coordinate the location of connection pins among IMMs and may integrate the grouping of the connection pins for multiple IMMs.

DETAILED DESCRIPTION OF THE PREFERRED EMBODIMENTS OF THE INVENTION

Those of ordinary skill in the art will realize that the following description of the present invention is illustrative only and not in any way limiting. Other embodiments of the invention will readily suggest themselves to such skilled persons after an examination of the within disclosure.

Figure 2:
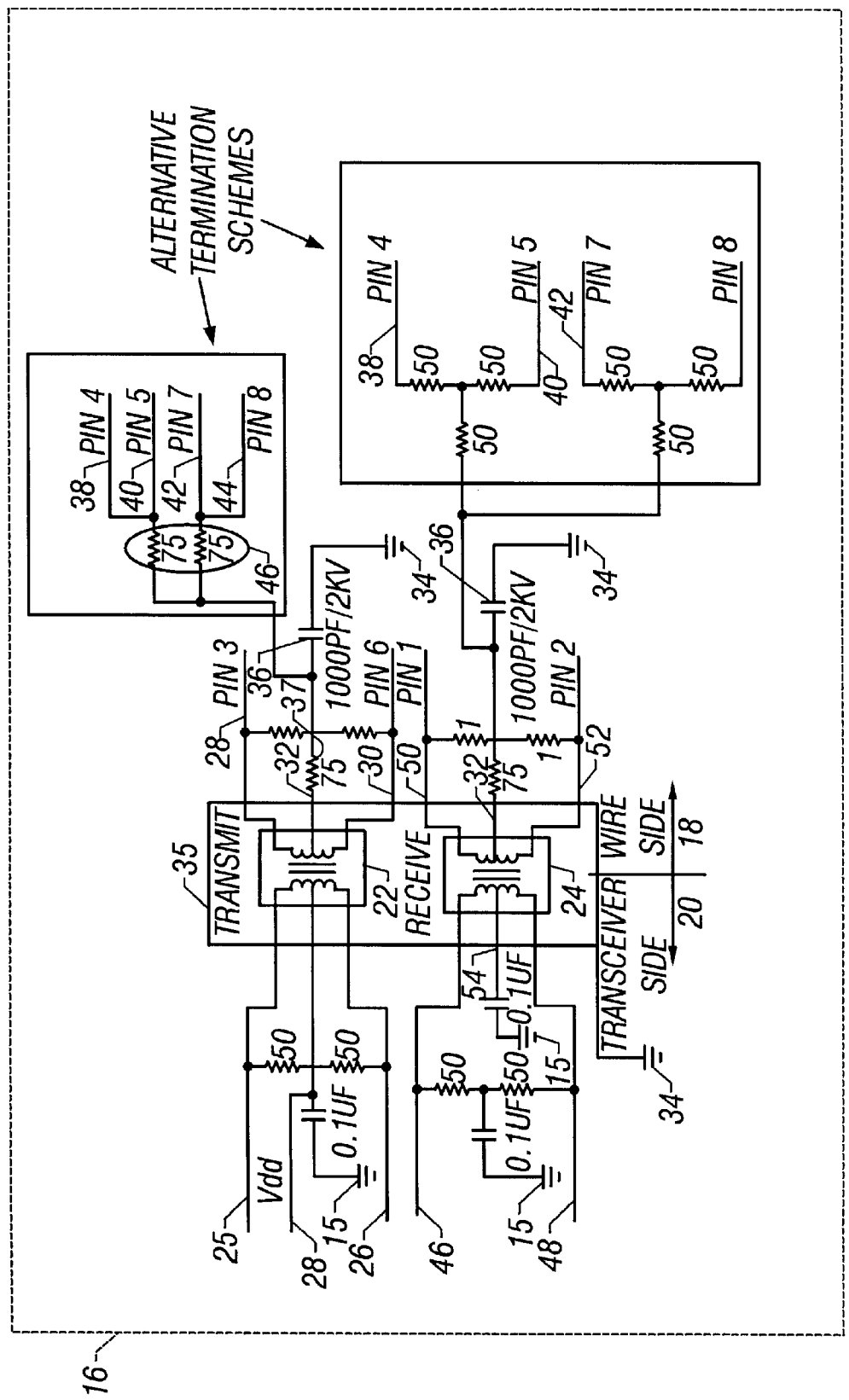
FIG. 2 is a schematic diagram of an integrated magnetics module (IMM).

The present invention provides a design for a connection pin layout for use in connecting integrated magnetics modules (IMMs) to a printed circuit board (PCB). Referring now to FIG. 2, a schematic diagram of an IMM 16 used in conjunction with a single eight-conductor cable 2 is shown. Such a configuration might be used with an Ethernet 10Base-T protocol network. It is convenient to think of an IMM 16 as being divided into two "sides": a "wire side" 18 corresponding to connections to the cable, and a "transceiver side" 20 corresponding to connections to the PCB 12. The prior art connection pin layouts tend to follow the layout of the wire side 18, while the present invention is based on the transceiver side 20, which more closely maps the signals sent to the PCB. The present invention also focuses on the coordination and integration of multiple cable connections to an extent not found in the prior art.

It is desirable to separate the power or $V_{dd}$ signal from the data signals in order to minimize interference with the data signals transferred to and from the cable and to maintain a "clean" $V_{dd}$, the present invention uses the connection pin layout to reduce this interference. The cable conductor to IMM 16 connections are not made by connection pin layout of the present invention. A principle design feature of IMM 16 is the integration of the cable connection with the magnetics. The cable to IMM 16 connections for a typical RJ-45 connector are, however, shown in FIG. 2 to illustrate the context of the present invention. The present invention, with one exception discussed below, addresses the connections of transceiver side 20 of IMM 16 to PCB 12. The transceiver side 20 of transmit port 22 is connected to conductors 25 and 26, which may carry data signals from PCB 12 to cable 2, and center tap connection 28 supplying electrical power. This power may be the $V_{dd}$ voltage used on the PCB. This disclosure uses the terms power and $V_{dd}$ interchangeably. The wire side 18 of transmit port 22 is connected to conductors 28 and 30, which correspond to pins 3 and 6 respectively of the RJ-45 connector, and center tap connection 32. Center tap connection 32 may be used as a connection to chassis ground 34. The RC components, such as capacitor 36 and resistor 37, are optional, although preferred, filters between center tap connection 32 and chassis ground 34. Chassis ground 34 is the common ground plane which may be used by most components on PCB 12, for example, metal shielding 35 surrounding IMM 16 is directly connected to the chassis ground 34. The only wire side 18 terminal routed to the connection pin layout is chassis ground 34.

The wire side 18 of receive port 24 is connected to conductors 50 and 52, which correspond to pins 1 and 2 of the RJ-45 connector. In one embodiment of the present invention an optional center tap connection 32 is included on the wire side 18 of receive port 24. When this optional center tap connection 32 is provided, it is typically connected to center tap connection 32 on transmit port 22. The transceiver side 20 of receive port 24 is connected to conductors 46 and 48, which may carry data signals from cable 2 to PCB 12, and a center tap connection 54 to transceiver ground 15.

Figure 1:
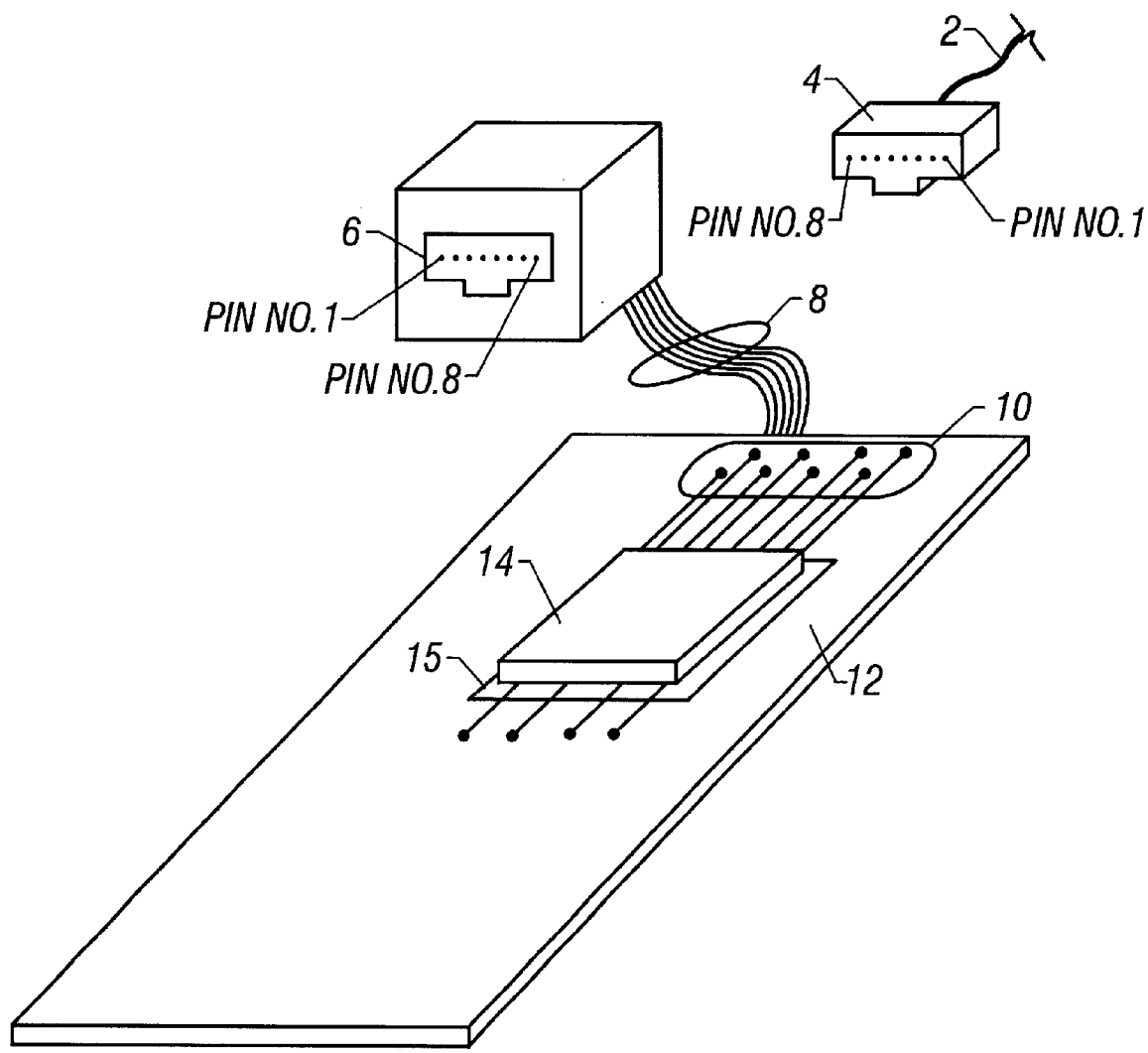
FIG. 1 is a perspective view of printed circuit board with a conventional magnetics module and a cable connector.

In one embodiment of the present invention, transceiver ground 15 is isolated from chassis ground 34, in another embodiment, transceiver ground 15 is connected to chassis ground 34. By providing a separate transceiver ground 15, the present invention permits a more complete isolation of the data and power signals and allows for a wider variety of IMM 16 designs. Referring now to FIG. 1, a transceiver ground 15 is shown below magnetics package 14. Many pre-IMM 16 transceivers designs, with a magnetics package 14 mounted directly on the surface of PCB 12, used such a (separate) transceiver ground 15 in order to isolate the data and power signals and reduce EMI. The same design scheme, with separate transceiver ground 15 and chassis ground 34, has carried over to some IMMs 16. The reason for using this separate chassis ground 34 is to minimize the interference on data signals processed by magnetics module 14 from the relatively "noisy" transceiver ground. The present invention thus may provide separate connection pins for transceiver ground 15 and chassis ground 34 to accommodate such IMM 16 designs that utilize two separate grounds. Those of ordinary skill in the art will recognize that a connection, such as a short or a filter or a capacitor or a choke, between transceiver ground 15 and chassis ground 34 may be used to provide continuity between the two separate grounds. Optional connections to transceiver ground 15 are shown on the transceiver side 20 of both transmit port 22 and receive port 24 for conductors 25, 26, 46 and 48 in FIG. 2. Those of ordinary skill in the art will recognize that the particular RC filter components 36, 37 and 46 shown are merely representative of those that may be used, and the present invention is not intended to be limited to the use of any optional connection to transceiver ground or particular configuration of filters.

RJ-45 connectors used in an Ethernet 10 Base-T protocol network typically use only four of the eight-conductor cables for data, leaving pins 4, 5, 6 and 7 unused. In FIG. 2, two alternative termination schemes for unused conductors 38, 40, 42 and 44 are shown. RC circuit components such as capacitor 36 and resistors 46 as filters are optional, although preferred. Those of skill in the art will recognize that other possible termination schemes include not connecting unused conductors 38, 40, 42, and 44 to the chassis ground 34 at all, and the omission of the RC components for a direct connection to chassis ground 34. The present invention is not, however, intended to be limited to any particular termination scheme for unused cable conductors.

In some embodiments of the present invention, pins 1 and 2 connect to transmit port 22 and pins 3 and 6 connect to receive port 24. Those of skill in the art will recognize that such an embodiment merely requires switching the identity of the connections shown in FIG. 2, and that the present invention is not intended to be limited to any particular use of cable conductors for transmitting and receiving data. Similarly, in some embodiments of the present invention, $V_{dd}$ is supplied to the center tap of the receive port with the center tap of the transmit port connected to ground. Such reversal of $V_{dd}$ and transceiver ground is intended to be within the scope of the present invention.

The connections required between IMM 16 in FIG. 2 and the PCB 12 include: two connections for each transmit and receive port, such as conductors 25, 26 and 46, 48; a power connection, such as conductor 28; and one or more ground connections, such as connections 32 and 54. As additional IMMs 16 are connected to PCB 12, there is a potential to coordinate and integrate the IMM 16 connections. That is, the power and ground connections to each IMM 16 do not need to be independent of each other, although they may be independent. In order to connect an additional IMM 16, such as that shown in FIG. 2 to a PCB 12, only four additional connections are required. These would correspond to two connections each for the transceiver side 20, i.e., for the transmit 22 and receive ports 24. Additional power and ground connections for the additional IMM 16 would be redundant and may be omitted.

Figure 3:
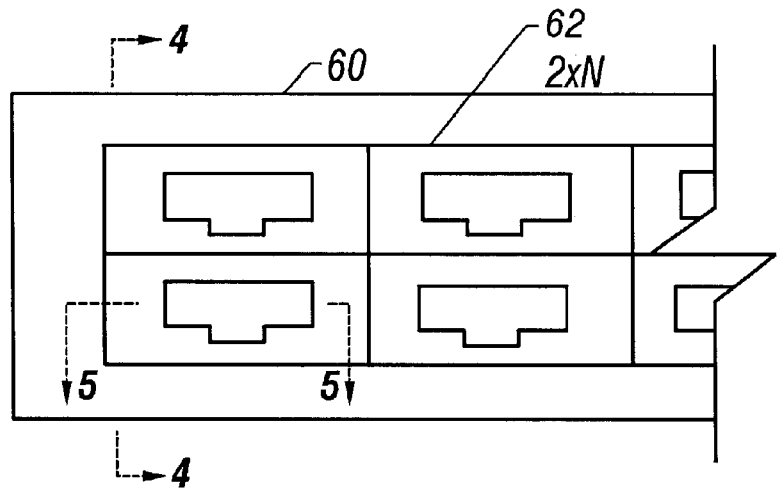
FIG. 3 is a partial elevation of a network device with a two-high arrangement of cable connectors.
Figure 4:
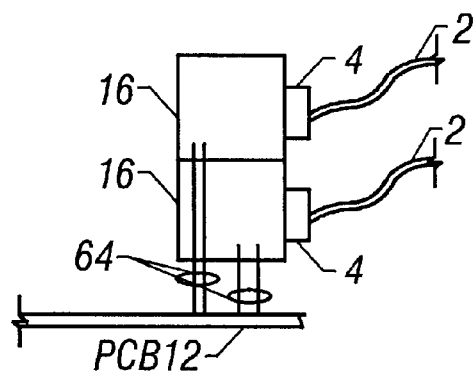
FIG. 4 is a sectional view of the cable connectors and IMMs corresponding to FIG. 3.
Figure 5:
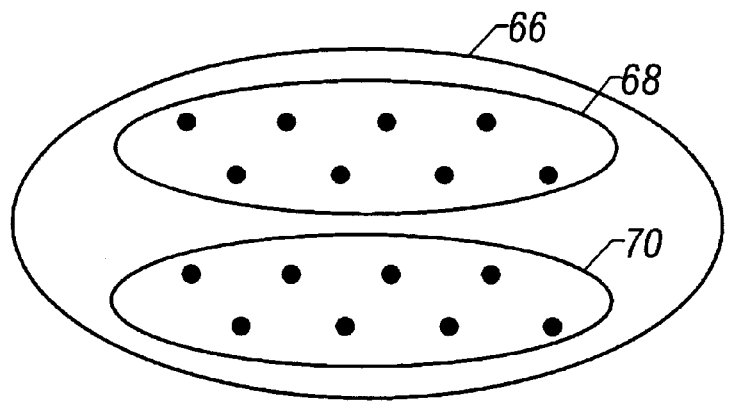
FIG. 5 is a sectional view of the connection pin layout corresponding to FIGS. 3 and 4.

In many applications, such as, but not limited to, network switches and hubs, cable connections and the associated IMMs 16 are organized in pairs. That is, there may be two horizontal rows of cable connectors, this two-high configuration is often referred to as a "2×" arrangement, such as a 2×8 with sixteen cable connectors arranged as two horizontal rows of eight cable connectors. This 2× arrangement of IMMs 16 affects their design and the connection pin layout used for transferring signals between IMMs 16 and the PCB 12. A 2× horizontal arrangement of IMMs 16 will be used to illustrate an embodiment of the present invention. Referring to FIG. 3, a partial elevational view of a network device 60 is shown with a 2×N arrangement of cable connectors 62. Sectional views taken from FIG. 3 are shown in FIGS. 4 and 5. FIG. 4 shows two cables 2, plugs 4 and an associated pair of IMMs 16 mounted on and near the edge of and a PCB 12 with conductors 64. FIG. 5 depicts a sectional view beneath the pair of IMMs 16, showing the connection pin layout (or the "footprint") of the connections between PCB 12 and IMMs 16. In the embodiment shown FIGS. 3–5 there are two sets of conductors 64, one for each IMM 16. The footprints of the two sets of conductors are shown by reference numbers 68 and 70.

The present invention coordinates the connection pin layout 66 between the pair of IMMs 16 when used with 2× arrangement of IMMs 16. More generally, the present invention coordinates the connection pin layout 66 with one or more IMMs 16, with no inherent limit on the number of IMMs 16. This disclosure will first describe in detail an embodiment used with a 2× arrangement of IMMs 16 and then address the general case. Those of ordinary skill in the art will recognize that the present invention is not intended to be limited to any particular arrangement of IMMs 16. It is desirable to isolate as much as possible the power or $V_{dd}$ signal from the data signals in order to minimize EMI imposed on the data signals transferred to and from the cable, and on the $V_{dd}$ signal from the data signals. The present invention uses a novel connection pin layout in order to reduce this interference.

Prior art connection pin layouts treat the two sets of conductors 64 independently. The only coordination or cooperation required between paired IMMs 16 allows for each conductor to pass to PCB 12 and occupy a different portion of the connection pin layout 66. For example, in the connection pin layout 66 shown in FIG. 5, the two rows of connection pins 68 correspond to the top IMM 16 and rows 70 to the bottom IMM 16.

Figure 6A:
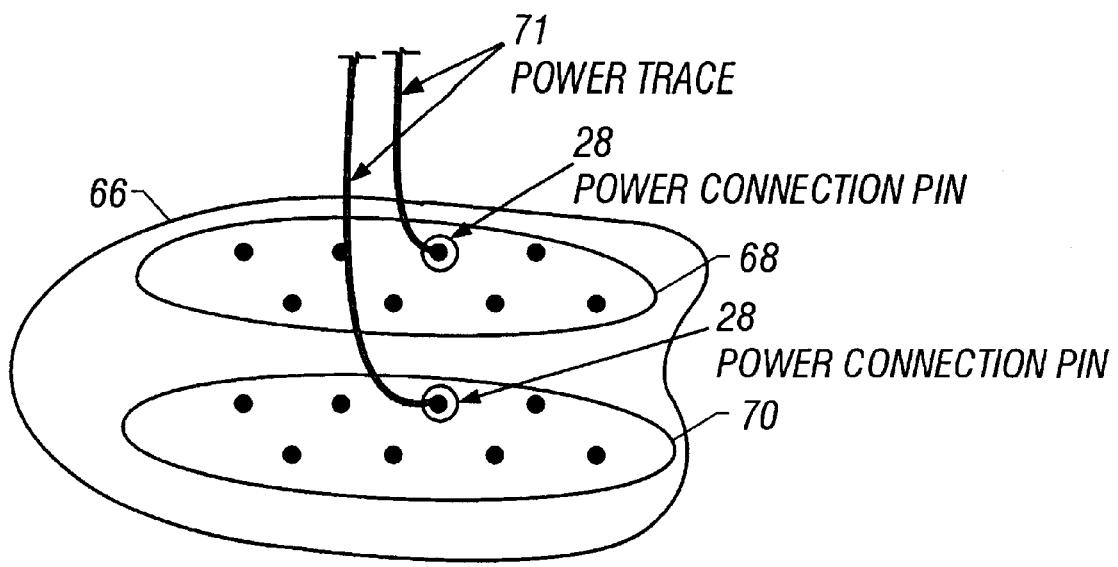
FIG. 6A is a diagram of prior art power trace connections to two sets of connection pins.
Figure 6B:
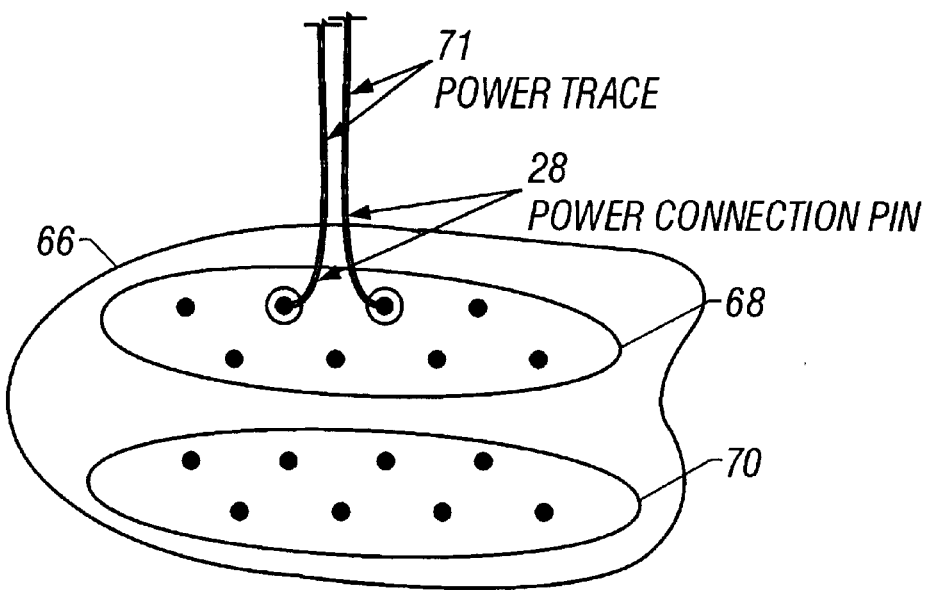
FIG. 6B is a diagram of power trace connections to two sets of connection pins in accordance with one embodiment of the present invention.

FIGS. 6A and 6B show connection pin layouts 66 with an overall geometry matching that shown in FIG. 5. FIGS. 6A and 6B, however, also include the $V_{dd}$ traces 71 to connection pin layouts 66. FIG. 6A corresponds to the prior art, where two separate $V_{dd}$ traces 71 are used, one for each IMM 16. FIG. 6B shows an embodiment of a connection pin layout in accordance with the present invention. The $V_{dd}$ traces 71 shown in FIG. 6B are located together and neither passes under the area containing the data connection pins, reducing the potential for EMI effects between $V_{dd}$ and data signals.

Figure 7:
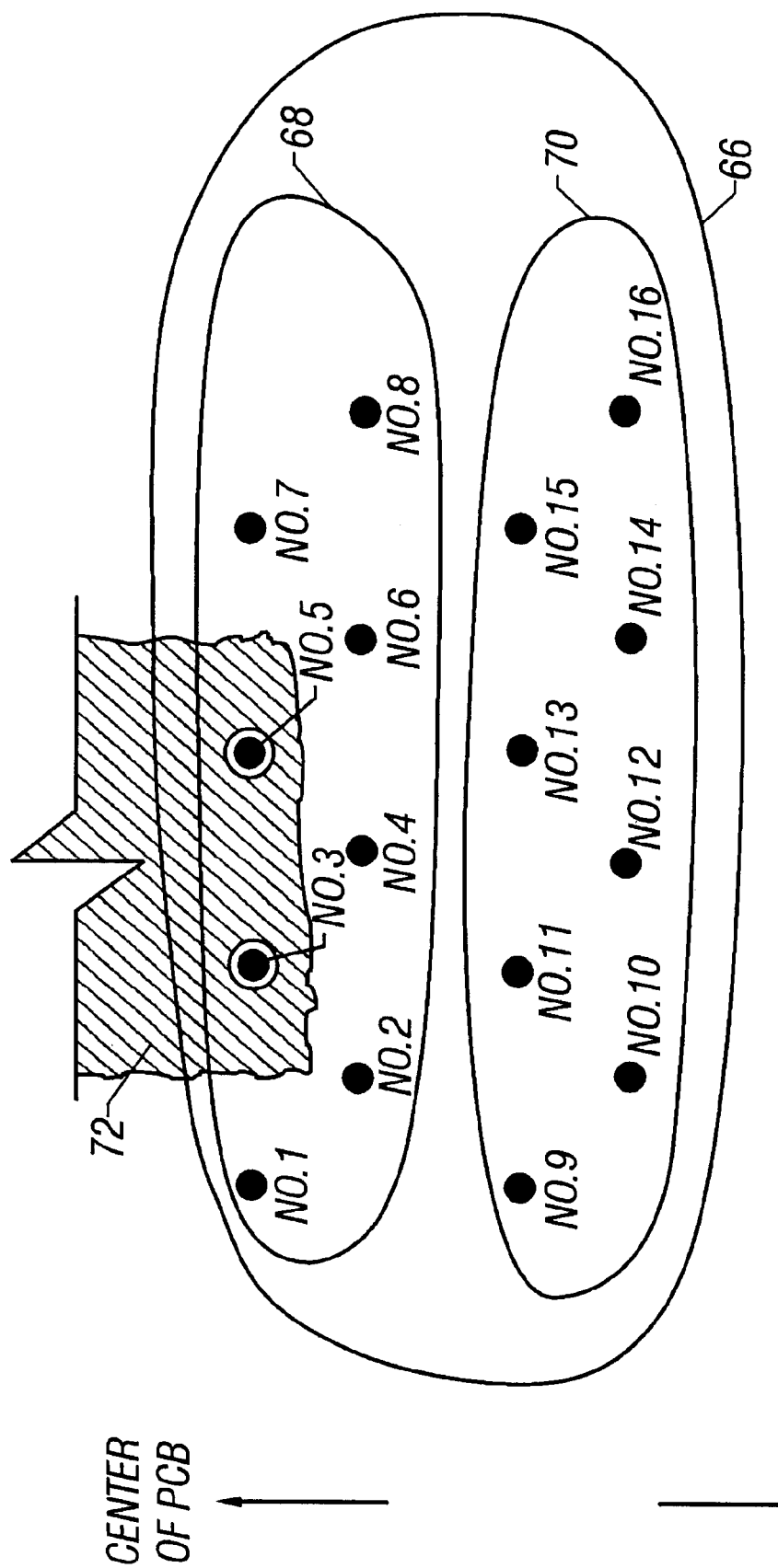
FIG. 7 is a connection pin layout for a two-high arrangement of IMMs in accordance with one embodiment of the present invention.

The present invention locates the $V_{dd}$ pins together on the periphery of the connection pin layout 66 and orients the connection pin layout so that the power connection pins can be connected to the PCB 12 by a $V_{dd}$ trace 71 that does not cross (over or under) the traces for the other signals. Both the design rule of not allowing the $V_{dd}$ trace 71 to cross the traces of the other signal and the rule of locating the $V_{dd}$ pins together on the periphery are required for the effective separation of the $V_{dd}$ and the data signals. This is because the depth dimension of PCB 12 is typically relatively small compared to the dimensions of the footprint of connection pin layout 66 on the surface of PCB 12, thus separation of the signals within the area of connection pin layout 66 would be defeated if traces were routed to cross just below the surface of that area. In FIG. 7, the $V_{dd}$ trace 71 would be located within the area shown by reference number 72 and the entire connection pin layout 66 would be oriented so that area 72 is on the side of the connection pin layout 66 toward the center of the PCB 12, and thus away from the edge of PCB 12. This orientation of the power connection pins with respect to the rest of the PCB 12 enables $V_{dd}$ trace 71 to routed to the connection pin layout 66 without crossing under the other signal traces or the other pins. In FIG. 7, $V_{dd}$ trace 71 will not be routed through any location that has a projection onto the surface of the PCB 12 outside of the area 72. Since $V_{dd}$ trace 71, as well as the other traces may be located on different layers of the PCB 12, it is the perpendicular projection of the $V_{dd}$ trace 71 onto the PCB 12 surface, as represented by the area 72, that does not cross the projections of the other traces. Location of the connection pin layout 66 near the edge of PCB 12 and oriented such that $V_{dd}$ trace 71 is routed toward the center of PCB 12, with a contiguous grouping of the $V_{dd}$ pins on the periphery of the connection pin layout 66 and outside the area "containing" the data and ground pins, meets the design rules of the present invention.

Referring to FIG. 7, a complete pin connection layout 66 in accordance with the present invention is shown. The identity of the pins in FIG. 7 are given in Table 1 below. The two sets of connector pins 68 and 70 are no longer independent, with each mapped to a single IMM 16. For example, the power connections 28 for IMMs 16 are pin numbers 3 and 5, with both located within the set of connector pins 68. Similarly, the receive port connections for both IMMs 16 are pins numbers 10, 12, 14 and 15 and all are located within the set of connector pins 70. The transceiver ground 15 and chassis ground 34 connections shown in FIG. 2 exemplify a two ground plane design, this embodiment is used in Table 1 below

TABLE 1

| Pin No. | Connection |
| --- | --- |
| 1 | Transmit - IMM 1 |
| 2 | Transmit - IMM 2 |
| 3 | Power - IMM 1 |
| 4 | Transceiver Ground - Either IMM |
| 5 | Power - IMM 2 |
| 6 | Transmit IMM 2 |
| 7 | Transmit IMM 1 |
| 8 | Chassis Ground - IMM 1 |
| 9 | Chassis Ground - Either IMM |
| 10 | Receive - IMM 1 |
| 11 | Transceiver Ground - IMM 1 |
| 12 | Receive - IMM 2 |
| 13 | Transceiver Ground - IMM 2 |
| 14 | Receive - IMM 2 |
| 15 | Receive - IMM 1 |
| 16 | Chassis Ground - IMM 2 |

A more general description of the present invention involves connecting N IMMs 16 to a PCB 12, where the integer N can take on any value and is limited only by space on the PCB 12. One design involves providing N separate power connection pins 28 in the connection pin layout 66, with these power connection pins 28 located together, on the periphery of the connection pin layout 66 and oriented toward the PCB 12. Such a connection pin layout 66 may be supplied by a single $V_{dd}$ trace 71. Another alternative embodiment is to provide a number of $V_{dd}$ traces 71 to IMMs 16. If filtering the power is desired, then each $V_{dd}$ trace 71 may be separately filtered. Another possible arrangement is to provide a single power connection pin 28, carrying the power to all of the IMMs 16. Similarly, a ground connection to each IMM 16 may be made through a single connection pin. Of course, embodiments that use a separate transceiver ground 15 and chassis ground 34 would need at least one connection pin for each. There are a vast number of possible permutations using multiple power traces 71 and ground traces, all of which are intended to be within the scope of the present invention.

Figure 8:
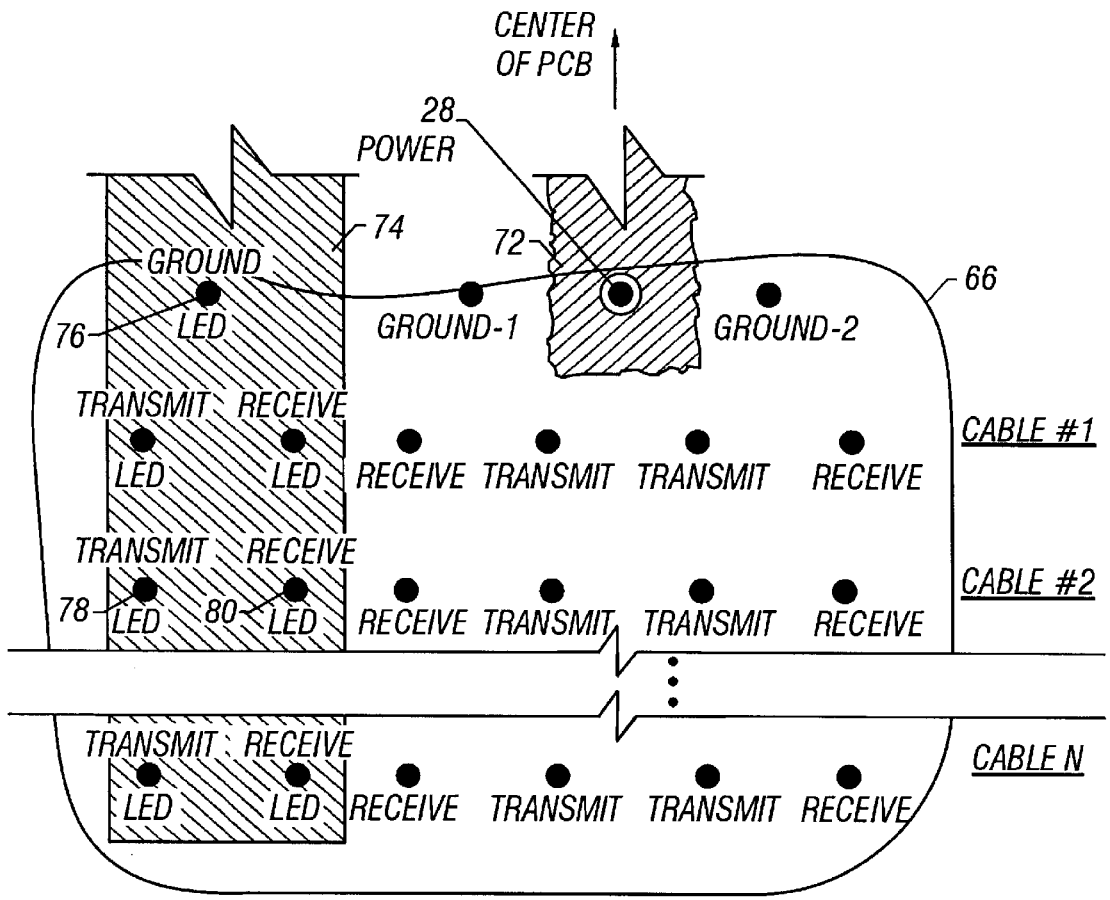
FIG. 8 is a connection pin layout for N IMMs in accordance with a second embodiment of the present invention.

In embodiments using a single connection pin for power and each ground, the connection pin layout 66 can be modified to accommodate additional IMMs 16 by adding only connection pins for the required transmit and receive conductors. IMMs 16 corresponding to an Ethernet 10Base-T network, such as shown in FIG. 2, would require four connection pins for each network cable 2 in addition to the power 28 and ground pins shared by all the cables 2. A connection pin layout 66 for such a design is shown in FIG. 8. The connection pin layout 66 in FIG. 8 is not limited to use with IMMs 16 in a 2× arrangement, although it may be used with such an arrangement. In another embodiment of the present invention, more than one transmit and receive port is used by each IMM 16. The connection pin layout 66 shown in FIG. 8 can easily be modified to allow for such an embodiment by adding additional connection pins for each cable 2. Similarly, in other embodiments of the present invention where, because of high currents, a single power connection pin 28 in inadequate, additional power connections 28 can be added to the design shown in FIG. 8.

There are many possible connection pin layouts, in addition to the those shown in FIGS. 7 and 8 that fall within the scope of the present invention. Choosing among the many possible connection pin layouts 66 for a specific application, secondary considerations involving the location of the other connections may be involved. One such secondary consideration is to keep the receive port 24 signal connection pins away from the power connection pins 28, while allowing the less sensitive transmit port 22 signal connection pins less separation from the power pins 28. The connection pin layout in FIG. 7 and described in Table 1 is based on these secondary considerations. Other secondary considerations may include separation of transmit port 22 and receive port 24 connection pins, in order to minimize cross-talk, and separation of the transceiver ground 15 connection pins from both the transmit port 22 and power connection pins 28.

Another embodiment of the present invention incorporates light emitting diode (LED) signals into the connection pin layout. Typically these LEDs illuminate in conjunction with data processing activity within a particular transmit or receive port. There are numerous methods of supplying an LED a signal in conjunction with such data processing. Such methods include providing the signal via a separate pair of power and ground conductors. The present invention is not, however, intended to be limited to any particular method of illuminating LEDs. An LED configuration 74, using a common LED ground 76 with separate receive LED and transmit LED power signals for each cable 2, is shown in FIG. 8. When there are one or more LED signals connected between the PCB 12 and an IMM 16, the present invention locates the LED connection transmit pins 78 and receive pins 80 in a manner analogous to that used with power signals. That is, the LED signal connection pins are located at the periphery of the connection pin layout 66 and the signal traces to these pins are kept from crossing the area containing the data signals. All of the LED signals, and traces for the LED signals, are located within the area shown by reference number 74.

Figure 9:
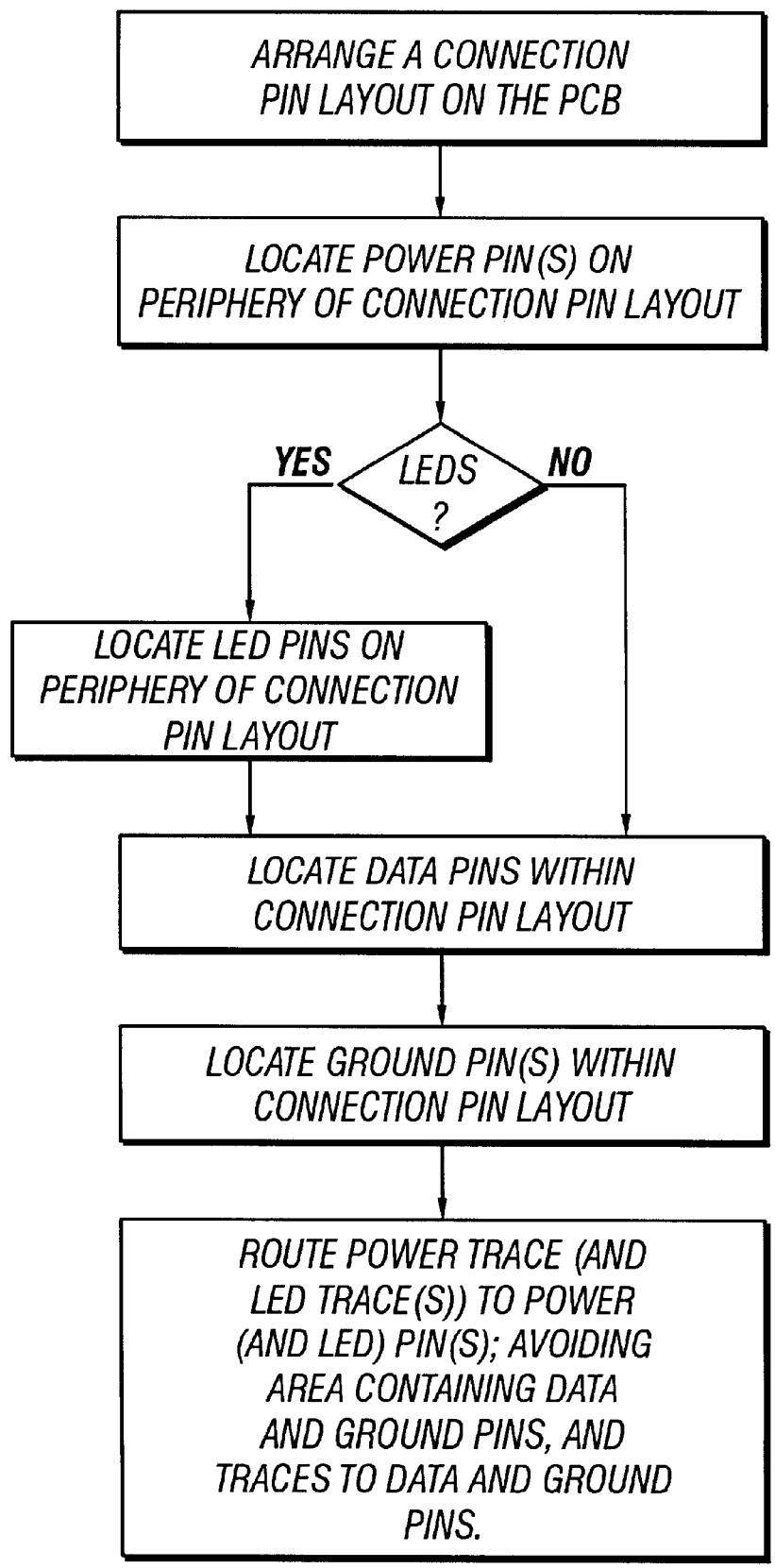
FIG. 9 is a flowchart for creating a connection pin layout in accordance with the present invention.

Referring to FIG. 9, a flowchart of the process for creating a connection pin layout 66 in accordance with the present invention is shown.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A printed circuit board (PCB) including a connection pin layout for connecting an integrated magnetics module to the PCB, comprising:
   a power pin for connecting power between the integrated magnetics module and the PCB, said power pin located on a periphery of the connection pin layout;
   a plurality of data pins for making a plurality of data connections between the integrated magnetics module and the PCB, wherein said plurality of data connections are encompassed by a data trace;
   a chassis ground pin for making a chassis ground connection between the integrated magnetics module and the PCB, wherein said chassis ground connection is encompassed by a chassis ground trace; and
   a power trace connecting said power pin to a source of electrical power, said power trace routed on the PCB, wherein said power trace circumvents a perpendicular projection of an area containing said plurality of data pins and said chassis ground pin and circumvents said data trace and said chassis ground trace.

2. A PCB in accordance with claim 1, further comprising a transceiver ground pin for making a transceiver ground connection between the integrated magnetics module and the PCB.

3. A PCB in accordance with claim 1, further comprising:
   a light emitting diode (LED) pin for making a LED connection between the integrated magnetics module and the PCB, said LED pin located on a periphery of the connection pin layout; and
   a LED signal trace connecting said LED pin to the PCB circumventing said plurality of data pins or said chassis ground pin.

4. A PCB in accordance with claim 1, further comprising a power filter in series with said power trace and located between said power pin and the PCB.

5. A printed circuit board (PCB) including a connection pin layout for connecting a plurality of integrated magnetics modules to the PCB, comprising:
   a power pin for connecting power between the plurality of integrated magnetics modules and the PCB, said power pin located on a periphery of the connection pin layout;
   a plurality of data pins for making a plurality of data connections between the plurality of integrated magnetics modules and the PCB, wherein said plurality of data connections is encompassed by a data trace;
   a chassis ground pin for making a chassis ground connection between the plurality of integrated magnetics modules and the PCB, wherein said chassis ground connection is encompassed by a chassis ground trace; and
   a power trace connecting said power pin to a source of electrical power, said power trace routed on the PCB, wherein said power trace circumvents a perpendicular projection of an area containing said plurality of data pins and said chassis ground pin and circumvents said data trace and said chassis ground trace.

6. A PCB in accordance with claim 5, further comprising a transceiver ground pin for making a transceiver ground connection between the plurality of integrated magnetics modules and the PCB.

7. A PCB in accordance with claim 5, further comprising:
   a light emitting diode (LED) pin for making a LED connection between the integrated magnetics modules and the PCB, said LED pin located on a periphery of the connection pin layout; and
   a LED signal trace connecting said LED pin to the PCB circumventing said plurality of data pins and said chassis ground pin.

8. A PCB in accordance with claim 5, further comprising a power filter in series with said power trace and located between said power pin and the PCB.

9. A printed circuit board (PCB) including a connection pin layout for connecting a plurality of integrated magnetics modules to the PCB, comprising:
   a plurality of power pins for connecting power between the plurality of integrated magnetics modules and the PCB, said plurality of power pins located together and on a periphery of the connection pin layout;
   a plurality of data pins for making a plurality of data connections between the plurality of integrated magnetics modules and the PCB, wherein said plurality of data connections are encompassed by a data trace;
   a chassis ground pin for making a chassis ground connection between the plurality of integrated magnetics modules and the PCB, wherein said chassis ground connection is encompassed by a chassis ground trace; and
   a power trace connecting said plurality of power pins to a source of electrical power routed on the PCB, wherein said power trace circumvents a perpendicular projection of an area containing said plurality of data pins and said chassis ground pin and circumvents said data trace and said chassis ground trace.

10. A PCB in accordance with claim 9, further comprising a transceiver ground pin for making a transceiver ground connection between the plurality of integrated magnetics modules and the PCB.

11. A PCB in accordance with claim 9, further comprising:
   a light emitting diode (LED) pin for making a LED connection between the plurality of integrated magnetics modules and the PCB, said LED pin located on a periphery of the connection pin layout; and
   a LED signal trace connecting said LED pin to the PCB circumventing said plurality of data pins and said chassis ground pin.

12. A PCB in accordance with claim 9, further comprising a power filter in series with said power trace and located between said power pin and the PCB.

13. A method of connecting an integrated magnetics module to a printed circuit board (PCB), comprising:
   arranging a plurality of connection pins for connecting the integrated magnetics module to the PCB;
   assigning a power connection pin on a periphery of said plurality of connection pins;
   assigning a plurality of data connections from said plurality of connection pins, wherein said plurality of data connections is encompassed by a data trace;

assigning a chassis ground connection from said plurality of connection pins, wherein said chassis ground connection is encompassed by a chassis ground trace; and routing a power trace to said power connection pin, wherein said power trace circumvents a perpendicular projection of an area containing said plurality of data connections and said chassis ground connection and circumvents said data trace and said chassis ground trace.

14. A method in accordance with claim 13, further comprising assigning a transceiver ground connection from said plurality of connection pins.

15. A method in accordance with claim 13, further comprising assigning one or more LED connections on a periphery of said plurality of connection pins.

16. A method in accordance with claim 13, further comprising filtering said power trace.

17. A method of connecting a plurality of integrated magnetics modules to a printed circuit board (PCB), comprising:

arranging a plurality of connection pins for connecting the plurality of integrated magnetics modules to the PCB;

assigning a power connection pin on a periphery of said plurality of connection pins;

assigning a plurality of data connections from said plurality of connection pins, wherein said plurality of data connections is encompassed by a data trace;

assigning a chassis ground connection from said plurality of connection pins, wherein said chassis ground connection is encompassed by a chassis ground trace; and routing a power trace to said power connection pin, wherein said power trace circumvents a perpendicular projection of an area containing said plurality of data connections and said chassis ground connection and circumvents said data trace and said chassis ground trace.

18. A method of connecting a plurality of integrated magnetics modules to a printed circuit board (PCB), comprising:

arranging a plurality of connection pins for connecting the plurality of integrated magnetics modules to the PCB;

assigning a plurality of power connection pins located together and on a periphery of said plurality of connection pins;

assigning a plurality of data connections from said plurality of connection pins, wherein said plurality of data connections is encompassed by a data trace;

assigning a chassis ground connection from said plurality of connection pins, wherein said chassis ground connection is encompassed by a chassis ground trace; and routing a power trace to said power connection pin, wherein said power trace circumvents a perpendicular projection of an area containing said plurality of data connections and said chassis ground connection and circumvents said data trace and said chassis ground trace.

* * * * *